United States Patent
Matsui et al.

(10) Patent No.: US 6,662,442 B1
(45) Date of Patent: Dec. 16, 2003

(54) PROCESS FOR MANUFACTURING PRINTED WIRING BOARD USING METAL PLATING TECHNIQUES

(75) Inventors: Kouji Matsui, Osaka (JP); Kazunori Mune, Osaka (JP); Hirofumi Fujii, Osaka (JP); Satoshi Tanigawa, Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 09/619,502

(22) Filed: Jul. 19, 2000

(30) Foreign Application Priority Data

Jul. 19, 1999 (JP) ............................... 11-204066

(51) Int. Cl.⁷ ................................. H01K 3/10
(52) U.S. Cl. .............................. 29/852; 29/830; 29/846; 29/847; 427/97; 427/99; 430/311; 430/313; 430/315; 174/262; 174/257; 205/125
(58) Field of Search ............... 29/830, 846, 847, 29/852; 430/311, 312, 313, 315, 319; 427/96, 98; 361/792, 795, 793, 794; 174/266, 262, 257; 428/209, 901; 205/125, 126, 206

(56) References Cited

U.S. PATENT DOCUMENTS

| | | | | |
|---|---|---|---|---|
| 5,246,817 A | * | 9/1993 | Shipley, Jr. ................ | 430/312 |
| 5,323,520 A | * | 6/1994 | Peters et al. ................ | 29/25.42 |
| 6,162,580 A | * | 12/2000 | Matsuoka et al. ......... | 430/283.1 |
| 6,255,039 B1 | * | 7/2001 | Xu et al. ..................... | 430/318 |

FOREIGN PATENT DOCUMENTS

| | | |
|---|---|---|
| JP | A-7-186323 | 7/1995 |
| JP | A-10-135598 | 5/1998 |

* cited by examiner

*Primary Examiner*—Richard Chang
(74) *Attorney, Agent, or Firm*—Sughrue Mion, PLLC

(57) ABSTRACT

A process for producing a printed wiring board, particularly an interposer for a chip size package, which comprises the steps of (1) forming an outer insulator layer 22 having outer via-holes 24 on a substrate 32, (2) forming conducting passages 31 through the outer via-holes 24 by plating with metal up to substantially the same level as the upper surface of the outer insulator layer 22, (3) forming a thin metal film 29 on the outer insulator layer 22 and on the conducting passages 31, (4) forming a conductor layer 21 in a prescribed circuit pattern on the thin metal film 29 by plating, (5) removing the part of the thin metal film 29 on which the conductor layer 21 is not formed, (6) forming an inner insulator layer 23 on the conductor layer 21, and (7) removing the substrate 32. The outer insulator layer is formed with flatness to secure good adhesion to a semiconductor chip.

7 Claims, 7 Drawing Sheets

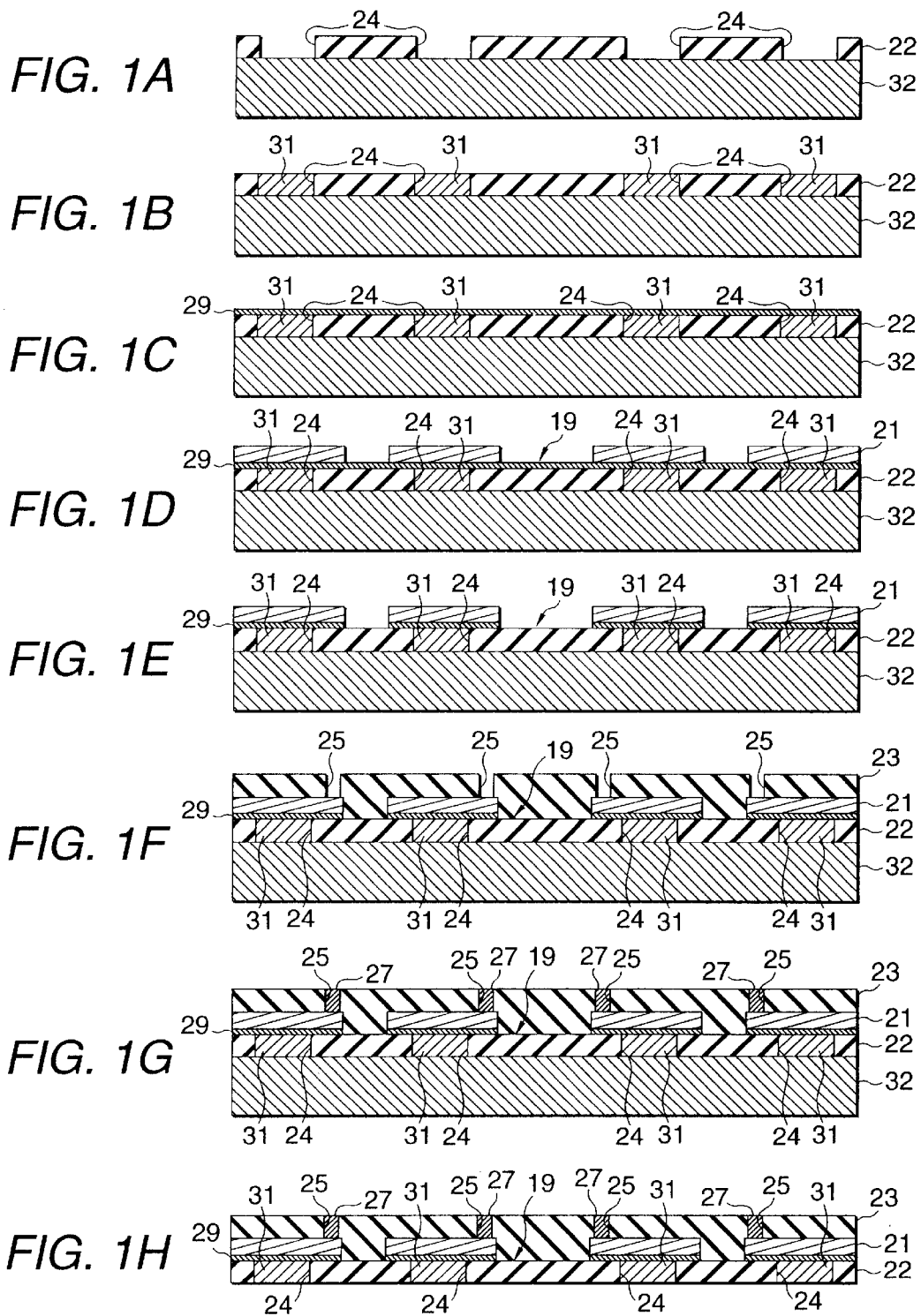

PROCESS FOR MANUFACTURING PRINTED WIRING BOARD USING METAL PLATING TECHNIQUES

FIELD OF THE INVENTION

This invention relates to a process for producing a printed wiring board and, more particularly, a printed wiring board suitable as an interposer of chip size packages for electrically connecting a semiconductor chip to an external printed wiring board and a process for producing the same.

BACKGROUND OF THE INVENTION

With the recent tendencies for electronic equipment to have smaller size and weight, semiconductor chip packages for mounting have been reduced in dimensions. In this line, so-called chip size packages (also called chip scale packages) have been developed as means for providing minimally packaged chips which are about the size of bare chips.

As shown in FIG. 9, a chip size package has an interposer 3, which is interposed between a semiconductor chip 1 and an external printed wiring board 2 to establish an electrical connection between the electrodes (not shown) of the chip 1 and those of the external printed wiring board 2.

The interposer 3 has a three-layer structure composed of an outer insulator layer 4, a conductor layer 6 formed on the outer insulator layer 4 in a prescribed circuit pattern, and an inner insulator layer 7 formed thereon. The outer insulator layer 4 has via-holes 8 mated with the electrodes of the external circuit board 2. The via-holes 8 provide conducting passages 9, which connect with outer electrodes 10 of bump form. The inner insulator layer 7 have inner via-holes 11 mated with the electrodes of the chip 1, on which flat inner electrodes 12 are provided.

The inner insulator layer 7 of the interposer 3 is joined to the back face of the chip 1 to connect the inner electrodes 12 and the electrodes of the chip 1. In surface mounting, the outer electrodes 10 of the package are connected to the electrodes of the external circuit board 2, whereby the electrodes of the chip 1 and those of the external printed wiring board 2 are electrically connected via the inner electrodes 12, the conductor layer 6, the conducting passages 9, and the outer electrodes 10 of the interposer 3. The semiconductor chip 1 has been sealed with a sealant 13.

In producing such an interposer 3, it is considered that the conductor layer 6 and the conducting passages 9 can be formed easily by plating techniques. Electroplating, for instance, is illustrated in FIGS. 11A–11E. As shown in FIG. 11A, an outer insulator layer 4 is formed on a negative electrode 14 for electroplating, and outer via-holes 8 are made through the outer insulator layer 4. A thin metal film 15 is formed on the upper surface of the outer insulator layer 4 and the upright wall and the bottom of the outer via-holes 8 as shown in FIG. 11B by, for example, sputtering. A plating resist 16 is formed on the thin metal film 15 at positions corresponding to the gaps between wires of a prescribed circuit pattern as shown in FIG. 11C. As shown in FIG. 11D, metal is deposited in the outer via-holes 8 to form conducting passages 9 and then on the conducting passages 9 and on the outer insulator layer 4 to form a conductor layer 6 of prescribed circuit pattern by electroplating. Then, the plating resist 16 and the part of the thin metal film 15 where the plating resist 16 has existed are removed by etching to leave the conductor layer 6 and the conducting passages 9 as shown in FIG. 11E.

Where plating is carried out in the above-described method, it is conceivable that the following problem occurs. Because metal deposited on the bottom of the outer via-hole 8 and metal deposited on the upper surface of the outer insulator layer 4 grows in almost the same manner, the part formed of the metal deposited on the bottom of the outer via-hole 8 (i.e., the conducting passage 9 and the part of the conductor layer 6 formed on the conducting passage 9) will have sunk in to make a shallow dent by the end of the plating, compared with the level of the other part formed of the metal deposited on the upper surface of the outer insulator layer 4 (i.e., the part of the conductor layer 6 that is not in contact with the conducting passage 9).

Should there be such a dent on the conductor layer 6, the inner insulator layer 7 formed thereon will also have a corresponding dent to have an uneven surface as illustrated in FIG. 10. This unevenness reduces adhesion between the semiconductor chip 1 and the inner insulator layer 7, or air trapped in the gap 17 between the chip 1 and the dent may expand thermally to cause separation (blistering), causing reduction in reliability.

SUMMARY OF THE INVENTION

An object of the present invention is to provide a process for producing a printed wiring board, in which a conductor layer can be formed without unevenness and has good adhesion to an insulator layer formed thereon to secure reliability.

Another object of the present invention is to provide a reliable printed wiring board produced by the process.

The invention provides a process for producing a printed wiring board comprising the steps of (1) forming a first insulator layer having first through-holes on a substrate, (2) forming conducting passages through the first through-holes by plating with metal up to substantially the same level as the upper surface of the first insulator layer, (3) forming a thin metal film on the first insulator layer and on the conducting passages, (4) forming a conductor layer in a prescribed circuit pattern on the thin metal film by plating, (5) removing the part of the thin metal film on which the conductor layer is not formed, (6) forming a second insulator layer on the conductor layer, and (7) removing the substrate.

In a preferred embodiment, the substrate is made of a material capable of serving as a negative electrode in electroplating. In another preferred embodiment, the second insulator layer has adhesiveness. In still another preferred embodiment, the circuit pattern of the conductor layer formed on the thin metal film by plating has an interval of 30 μm or smaller among the wires.

The invention also provides a printed wiring board produced by the above process. The printed wiring board is suitable as an interposer for chip size packages.

According to the invention, since the second insulator layer, which is to be joined to the back face of a semiconductor chip, is formed on the conductor layer which is substantially free from unevenness, it is adhered to a semiconductor chip with no gaps, and the reliability of the semiconductor device can be improved. Where the insulator layer has adhesiveness, the printed wiring board can be adhered to a semiconductor chip with good adhesion simply by uniform pressure application to secure reliability. Where the circuit pattern has an interval of 30 μm or smaller, the possibility of the second insulator layer's being sank in the gap of the circuit pattern can be lessened. The flatness of the surface of the second insulator layer is thus enhanced, securing the good adhesion to a semiconductor chip, which leads to improved reliability of the semiconductor device.

BRIEF DESCRIPTION OF THE DRAWINGS

FIGS. 1A–1H show the steps involved in the process of the present invention.

DETAILED DESCRIPTION OF THE INVENTION

Figure 2A:
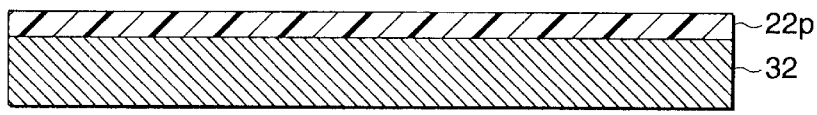
FIGS. 2A–2D show an embodiment of step (1) (formation of a first insulator layer having first through-holes on a substrate) of the invention.

The process for producing a printed wiring board according to the invention will be described in detail with particular reference to an interposer for chip size packages by referring to the accompanying drawings.

FIGS. 1A–1H are first referred to. In step (1) shown in FIG. 1A, an outer insulator layer 22, through which outer via-holes 24 are made as first holes, is formed on a substrate 32.

The substrate 32 is to support the outer insulator layer 22 and to secure rigidity of a conductor layer 21 and an inner insulator layer 23 provided thereon thereby to improve the workability in forming these layers. Where the outer insulator layer 22 and the inner insulator layer 23 are formed by applying a resin followed by curing, the substrate 32 also serves to prevent thermal shrinkage on curing. When the conductor layer 21 and the conducting passages 31 are formed by electroplating as hereinafter described, the substrate 32 can be used as a negative electrode for the electroplating.

Such a substrate 32 is required to have some rigidity. A metal film is preferably used as a substrate 32. 42 Alloy or stainless steel is particularly preferred for its stiffness (nerve), low linear expansion coefficient, ease of removal and ability of serving as a negative electrode in electroplating. While not limiting, the thickness of the substrate 32 is suitably about 10 to 100 µm.

The material of the outer insulator layer 22 is not particularly limited as far as it is electrically insulating. For example, it is formed of resins well-known in the art as an insulator of printed wiring boards, such as polyimide, polyether sulfone, polyether nitrile, polyethylene terephthalate, polyethylene naphthalate, and polyvinyl chloride. The thickness of the outer insulator layer 22, while not limited, suitably ranges from 5 to 50 µm.

Of the useful resins, photosensitive resins, such as photosensitive polyimide and photosensitive polyether sulfone, are preferably used so that forming the outer insulator layer 22 and making the outer via-holes 24 can be achieved simultaneously. The manner of forming the outer insulator layer 22 having through-holes 24 by use of a photosensitive resin is shown in FIG. 2A. In case of using photosensitive polyimide, for instance, a resin layer 22p of photosensitive polyamic acid, a precursor of photosensitive polyamide, is formed on the substrate 32. The photosensitive polyamide acid resin comprises a polyamic acid resin, which is obtained by the reaction between an acid dianhydride and a diamine, and a photosensitizer.

Preferred examples of the acid dianhydride are 3,3',4,4'-oxydiphthalic acid dianhydride (ODPA), 3,3',4,4'-biphenyltetracarboxylic acid dianhydride, pyromellitic dianhydride, 2,2-bis(3,4-dicarboxyphenyl)hexafluoropropane dianhydride (6FDA), and 3,3',4,4'-benzophenonetetracarboxylic acid dianhydride (BTDA). Preferred examples of the diamine are p-phenylenediamine (PPD), bisaminopropyltetramethyldisiloxane (APDS), and 4,4'-diaminodiphenyl ether (DDE).

The polyamic acid resin is prepared by allowing the acid dianhydride and the diamine at practically an equimolar ratio in an appropriate organic solvent (e.g., N-methyl-2-pyrrolidone, N,N-dimethylacetamide or N,N-dimethylformamide) at room temperature under atmospheric pressure for a predetermined period of time. The polyamic acid resin is obtained in the form of a solution.

The photosensitizer added to the polyamic acid resin preferably includes 1,4-dihydropyridine derivatives, especially 1-ethyl-3,5-dimethoxycarbonyl-4-(2-nitrophenyl)-1,4-dihydropyridine. The photosensitizer is usually added in an amount of 0.1 to 1.0 mol per mole of the total amount of the acid dianhydride and the diamine, i.e., the polyamic acid. If it is added in amounts exceeding 1.0 mol, the cured outer insulator layer 22 may have reduced physical properties. If the amount of the photosensitizer is less than 0.1 mol, sensitivity for forming the outer via-holes 24 tends to be insufficient. If desired, the photosensitive polyamic acid resin can contain an epoxy resin, bisallylnudic imide, maleimide, etc. It is preferred for the photosensitive polyamic acid resin for the outer insulator layer 22 to have a glass transition temperature (Tg) of 250° C. or higher, particularly 300° C. or higher, after curing.

The photosensitive polyamic acid resin is applied onto the substrate 32 to a given thickness by, for example, coating in a usual manner and dried, or transferring a previously prepared dry film of the resin having a given thickness to the substrate 32.

The outer polyamic acid resin layer 22p thus formed is exposed to light through a photomask and developed to form the outer insulator layer 22 having the via-holes 24. If necessary, the exposed area may be heat treated at a prescribed temperature. For exposure, any radiation to which the photosensitive polyamic acid resin is sensitive, such as ultraviolet rays, electron beams or microwaves, can be used. The exposed area of the polyamic acid resin layer 22p is rendered soluble in the subsequent development (positive) by heating, for example, at 130° C. or higher and below 150° C., or insoluble in the subsequent development (negative) by heating, for example, 150 to 180° C. Development can be carried out in a conventional manner, for example, by soaking in or spraying with a known developer, such as an alkaline solution.

Figure 2B:
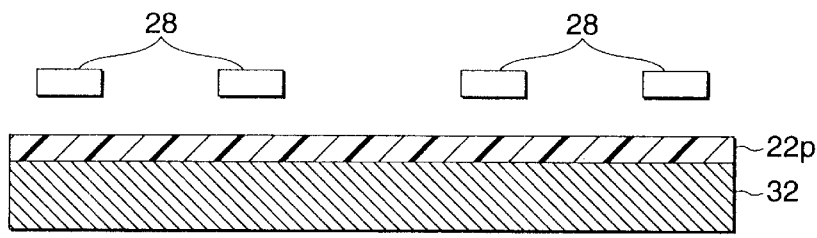
Figure 2C:
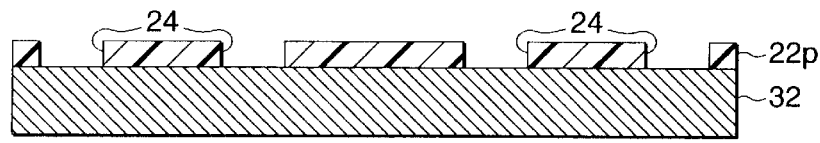

While the outer via-holes 24 can be made by either positive or negative patterning as described above, a negative patterning mode, which is shown in FIGS. 2B and 2C, is preferred. In this case, a photomask 28 is properly positioned on the photosensitive polyamic acid resin layer 22p to be mated with the electrodes 36 of an external circuit board 35 (see FIG. 7). After the exposure, the polyamic acid resin layer 22p is heated at a prescribed temperature (e.g., 150 to 180° C.) to make the exposed area insoluble in development and then developed with an appropriate developer to dissolve and remove the unexposed area (the area masked under the photomask 28) thereby to form outer via-holes 24.

The polyamic acid resin layer 22p having the outer via-holes 24 is cured by, for example, heating to a final temperature of 250° C. or higher to form an outer insulator layer 22 of polyimide.

Figure 3A:
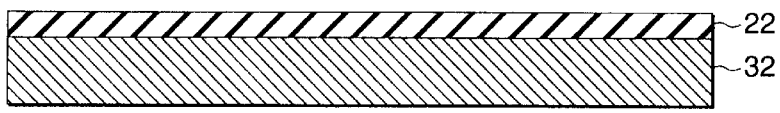
FIGS. 3A–3B show another embodiment of step (1) of the invention.
Figure 3B:
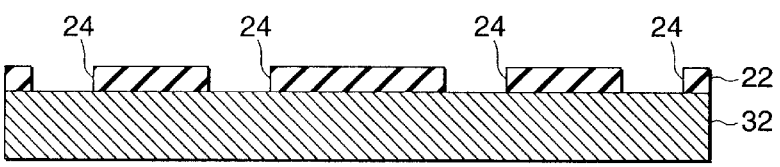

In FIGS. 3A and 3B are shown a manner of forming the outer insulator layer 22 having through-holes 24 without using a photosensitive resin. A resin is applied to the substrate 32 by coating or transferring a dry film of the resin to form an outer insulator layer 22 as shown in FIG. 3A. Then outer via-holes 24 are made by known techniques, such as laser machining or plasma machining as shown in FIG. 3B. It is also conceivable, while not shown, that a dry film previously having through-holes 24 is joined to the substrate 32.

Use of a photosensitive resin in the formation of the outer insulator layer 22 is advantageous over the manner comprising once forming the outer insulator layer 22 followed by making via-holes 24 by machining; for the former achieves formation of a great number of via-holes 24 at a fine pitch all at once, thus bringing about great saving of working time and improvement of workability. Such will establish an efficient production system, leading to cost reduction.

In step (2), illustrated in FIG. 1B, metal is made to deposit by plating in the outer via-holes 24 to substantially the same level as the upper surface of the outer insulator layer 22 to form conducting passages 31. Plating can be effected either by electroless plating or electroplating, but the latter is preferred. Where the conducting passages 31 are to be formed by electroplating, the substrate 32 can be of such a material that works as a negative electrode in electrolysis. Electroplating is carried out by using the substrate 32 as a negative electrode to deposit metal in the outer via-holes 24 until the height of the deposited metal reaches the level of the upper surface of the outer insulator layer 22. Metals which can be deposited by electroplating preferably include gold, copper, nickel, and solder. Copper is particularly preferred for its electrical characteristics and ease in forming the conducting passages 31. In this manner, metal grows only from the bottom of the outer via-holes 24 at almost the same deposition rate so that the conducting passages 31 can be formed without forming unevenness on their top surface.

In step (3), shown in FIG. 1C, a thin metal film 29 is provided all over the entire surface of the outer insulator layer 22 and the top surface of the conducting passages 31. The thin metal film 29 can be formed by known thin film forming techniques, such as plating and vacuum deposition. Vacuum deposition techniques, including sputtering, resistance heating evaporation, and electron beam evaporation, are preferably employed. Sputtering is particularly preferred. The metal of the thin metal film 29 is not particularly limited. Chromium or copper is referred where a conductor layer 21 which is provided on the thin metal film 29 in step (d) is copper. While not limiting, the thickness of the thin metal film 29 is suitably about 300 to 4000 Å. The thin metal film 29 may have a multilayer structure. For example, it can have a double layer structure composed of a 300 to 700 Å thick chromium layer and a 1000 to 3000 Å thick copper layer.

Figure 4A:
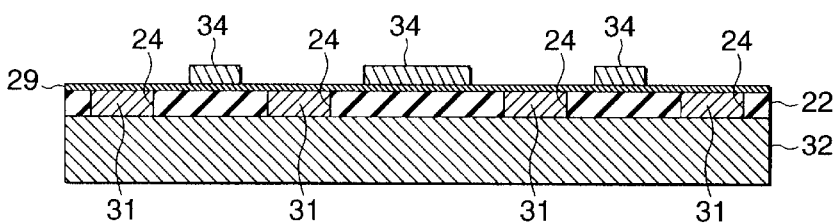
FIGS. 4A–4C show step (4) (formation of a conductor layer in a prescribed circuit pattern by plating) of the invention.
Figure 4B:
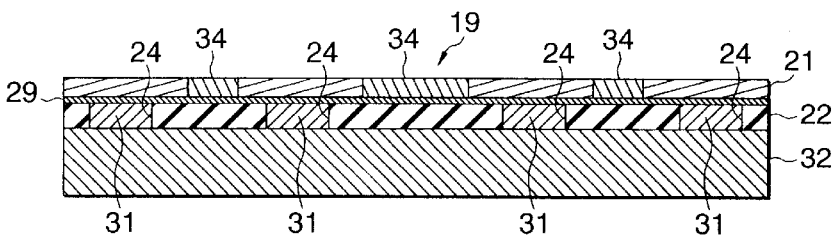
Figure 4C:
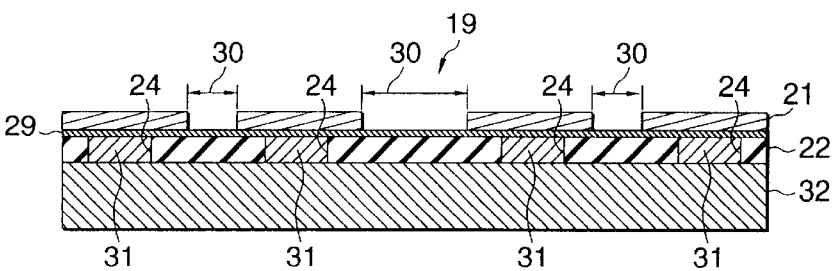

In step (4), shown in FIG. 1D, a conductor layer 21 having a prescribed circuit pattern 19 is formed on the thin metal film 29 by plating either by a subtractive manner or an additive manner. An additive manner is preferred. Patternwise formation of a conductor layer 21 by an additive manner is illustrated in FIGS. 4A–4C. In FIG. 4A, a plating resist 34 is formed on the thin metal film 29 in areas corresponding to the gaps or intervals between patterning wires. The plating resist 34 can be provided in a conventional manner by using, for example, a dry film resist. In FIG. 4B, a conductor layer 21 is formed by plating on the parts of the thin metal film 29 uncovered with the resist 34. Plating can be performed either by electroless plating or electroplating, but electroplating is preferred. Electroplating is conducted by using the substrate 32 as a negative electrode in the same manner as for the formation of the conducting passages 31 until metal is deposited to substantially the same height as the plating resist 34. The metal to be electrodeposited can be of the same kind as that used for the formation of the conducting passages 31. The metal of the conductor layer 21 may be either the same as or different from that of the conducting passages 31. Copper is preferred from the viewpoint of ease in forming the circuit pattern 19 and the electric characteristics. The thickness of the conductor layer 21 is not particularly limited and usually ranges from about 5 to 15 μm. The plating resist 34 is then removed by a conventional etching technique, such as chemical etching, whereby the conductor layer 21 having a prescribed circuit pattern 19 is provided as shown in FIG. 4C. In this embodiment, since metal is deposited only on the surface of the thin metal film 29 at an almost uniform rate to build up the conductor layer 21, the resulting conductor layer 21 has an almost flat surface, i.e., with no unevenness.

It is preferred that the circuit pattern 19 formed of the conductor layer 21 has intervals of 30 μm or smaller, particularly 10 to 30 μm, among the wires. For the patterning wires to be arranged at intervals of 30 μm or smaller is effective to prevent the inner insulator layer 23 formed thereon from sinking at the parts between adjacent wires of the pattern 19 and having unevenness on its surface.

While not shown, patternwise formation of a conductor layer 21 by a subtractive manner is carried out by forming the conductor layer 21 on the entire surface of the thin metal film 29, forming an etching resist on the conductor layer 21 in agreement with a prescribed circuit pattern, etching the conductor layer 21, and removing the etching resist.

In step (5), shown in FIG. 1E, the thin metal film 29 uncovered with the conductor layer 21 is removed by known etching techniques, for example, chemical etching.

Figure 5A:
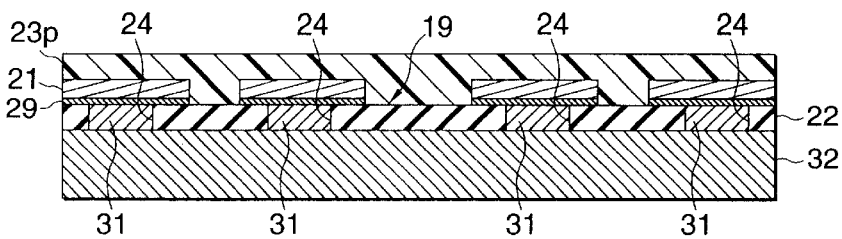
FIGS. 5A–5D show an embodiment of step (6) (formation of a second insulator layer on the conductor layer) of the invention.
Figure 5B:
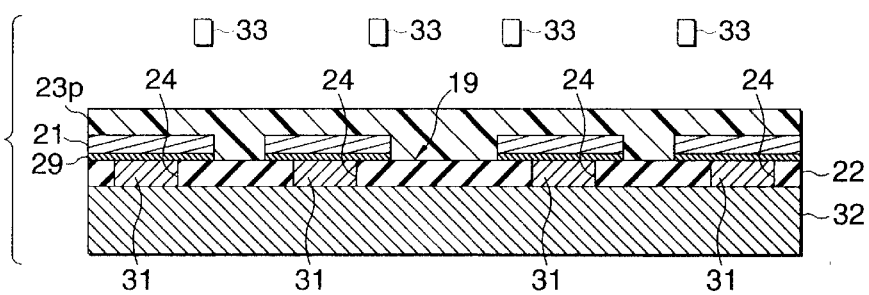
Figure 5C:
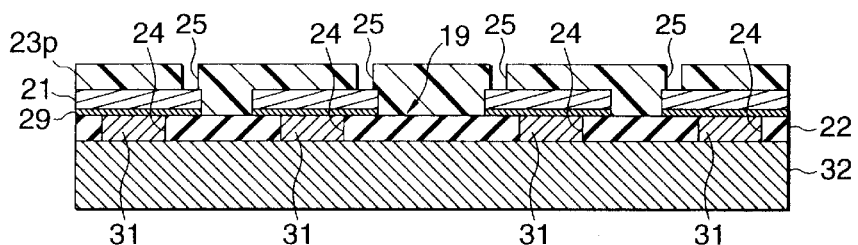

In step (6), shown in FIG. 1F, an inner insulator layer 23 is formed on the conductor layer 21 having the circuit pattern 19 as a second insulator layer, in which inner via-holes 25 (second through-holes) are made. The inner insulator layer 23 can be formed of the same resin in the same manner as for the outer insulator layer 22. The thickness of the inner insulator layer 23 is not particularly limited but suitably ranges from about 5 to 30 μm. It is preferred for the inner insulator layer 23 to have adhesiveness (heat fusibility) so that it may be adhered by heat fusion to a semiconductor chip 37 by itself. In this viewpoint, a photosensitive resin having adhesiveness, especially photosensitive polyimide having adhesiveness is used for preference.

Where the inner insulator layer 23 is formed of photosensitive polyimide, it is preferably formed in a negative patterning mode similarly to the formation of the outer insulator layer 22, which is illustrated in FIGS. 5A–5D. That is, a photosensitive polyamic acid resin layer 23p is formed on the conductor layer 21 as shown in FIG. 5A. The photosensitive polyamic acid resin layer 23p is irradiated through a photomask 33 which is properly positioned to be mated with the electrodes of the semiconductor chip 37 (see FIG. 7) as shown in FIG. 5B. After the exposure, the polyamic acid resin layer 23p is heated at a prescribed temperature to make the exposed area insoluble and then developed with an appropriate developer to dissolve and remove the unexposed area thereby to form inner via-holes 25 as shown in FIG. 5C.

The photosensitive polyamic acid resin for forming the inner insulator layer 23 is preferably prepared from 3,3',4,4'-oxydiphthalic acid dianhydride (ODPA), 2,2-bis(3,4-dicarboxyphenyl) hexafluoropropane dianhydride (6FDA), etc. as an acid dianhydride component and 1,3-bis(3-aminophenoxy)benzene (APB), bisaminopropyltetramethyldisiloxane (APDS), m-phenylenediamine (MPD), etc. as a diamine component. The photosensitizer can be selected from those useful in the photosensitive polyamic acid resins for the outer insulator layer. As previously mentioned, it is preferred for the inner insulator layer 23 to have adhesiveness after imidation. From this viewpoint, it is preferred for the photosensitive polyamic acid resin for the inner insulator layer 23 to have a melt viscosity (250° C.) of 1000 to 1,000,000 Pa.S, particularly 5,000 to 500,000 Pa.S, and a glass transition temperature (Tg) of 50 to 250° C., particularly 100 to 200° C., after curing (imidation).

Figure 6A:
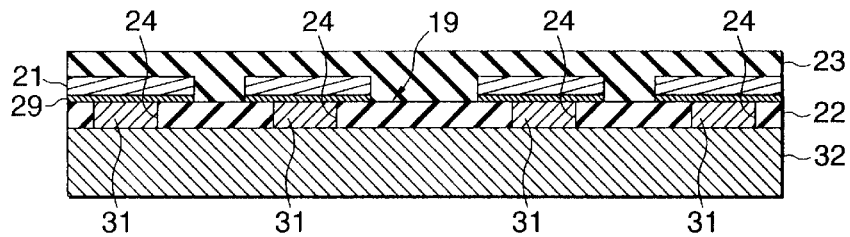
FIGS. 6A–6B show another embodiment of step (6) of the invention.
Figure 6B:
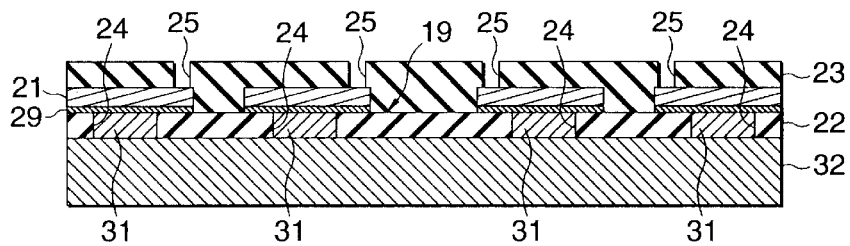

The polyamic acid resin layer 23p having the inner via-holes 25 is then cured by, for example, heating to a final temperature of 250° C. or higher to form an inner insulator layer 23 made of polyimide.

Where a photosensitive resin is not used for the formation of the inner insulator layer 23, a resin is applied to the conductor layer 21 by coating or transferring a dry film of the resin to form an inner insulator layer 23 as shown in FIG. 6A similarly to the formation of the outer insulator layer 22. Inner via-holes 25 are then made by known techniques, such as laser machining or plasma machining as shown in FIG. 6B. It is also conceivable, while not shown, that a dry film previously having through-holes 25 is joined to the conductor layer 21.

Use of a photosensitive resin in the formation of the inner insulator layer 23 is advantageous over the manner comprising once forming the inner insulator layer 23 followed by making via-holes 25 by machining; for the former achieves formation of a great number of via-holes 25 at a fine pitch all at once, thus bringing about great saving of working time and improvement of workability. Such will establish an efficient production system, leading to cost reduction.

Figure 7:
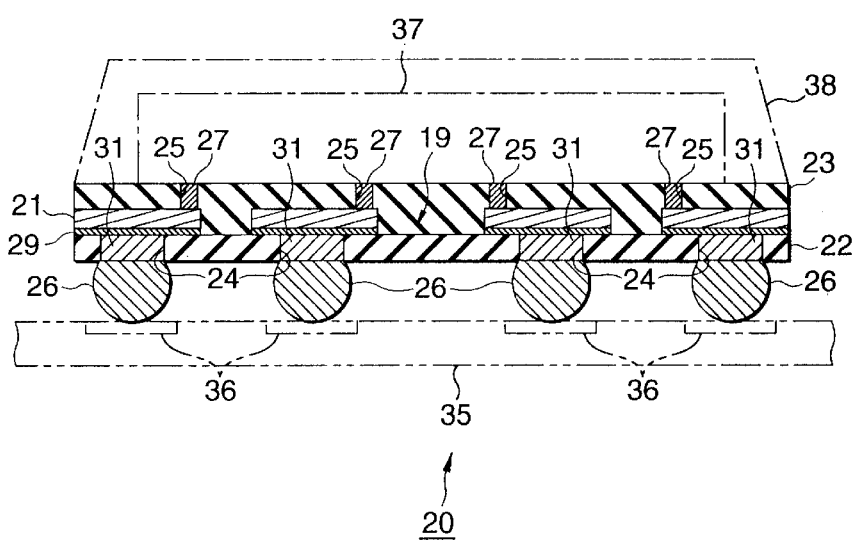
FIG. 7 is a cross section of an interposer for a chip size package as an application of the printed wiring board according to the invention.

As shown in FIG. 1G, inner electrodes 27 having a flat (or curved) top surface are provided in the inner via-holes 25 in a conventional manner, for example by plating with gold, copper, solder, etc. In step (7), shown in FIG. 1H, the substrate 32 is removed to obtain an interposer 20 (FIG. 7). The substrate 32 can be removed by known etching techniques, such as chemical etching. In case where the conductor layer 21 is formed in a semi-additive manner (not shown), the subbing layer 29 is exposed on stripping the substrate 32. The subbing layer 29 is also removed by known etching techniques, such as chemical etching.

In using the interposer 20 for surface mounting of semiconductor chips, outer electrodes 26 (bumps) are affixed to the conducting passages 31 of the outer insulator layer 22 as shown in FIG. 7. The interposer 20 is bonded to a semiconductor chip 37 by, for example, heat fusion to obtain a chip size package. The interposer 20 interposed between the chip 37 and the external printed wiring board 35 establishes electrical connections between the chip electrodes (not shown) and the respective electrodes 36 of the external printed wiring board 35 through the respective inner electrodes 27, the conductor layer 21, the respective conducting passages 31, and the respective outer electrodes 26.

The outer electrodes 26 can be formed in a conventional manner, for example, affixing solder balls or plating with gold, copper, solder, etc. The shape of the outer electrodes 26 can be decided appropriately according to the purpose and use. The semiconductor chip 37 has previously been sealed with a sealant 38.

Figure 8:
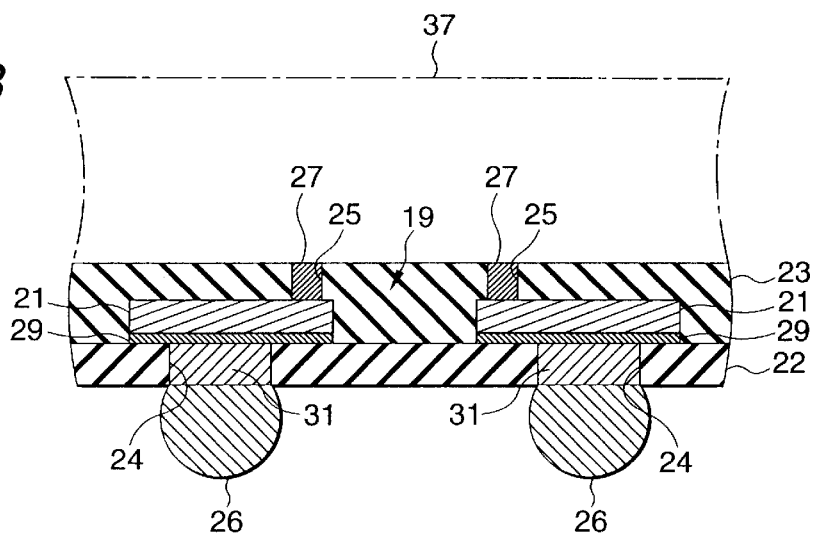
FIG. 8 is an enlarged view of FIG. 7.
Figure 9:
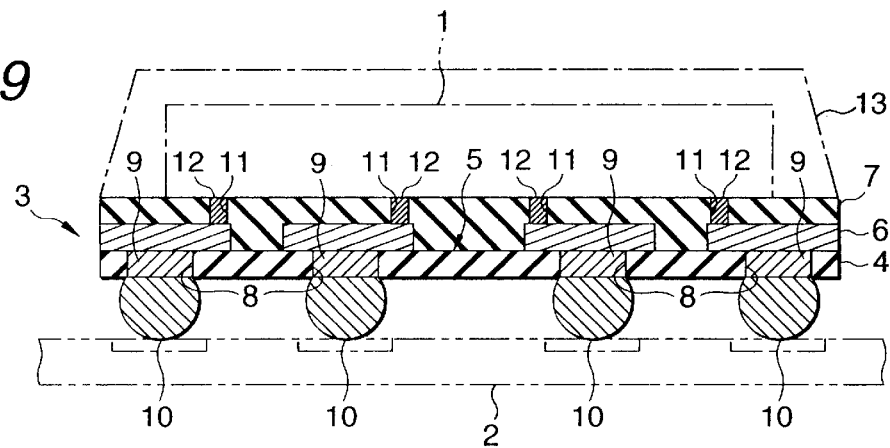
FIG. 9 is a cross section of an interposer for a chip size package, used for general explanation.
Figure 10:
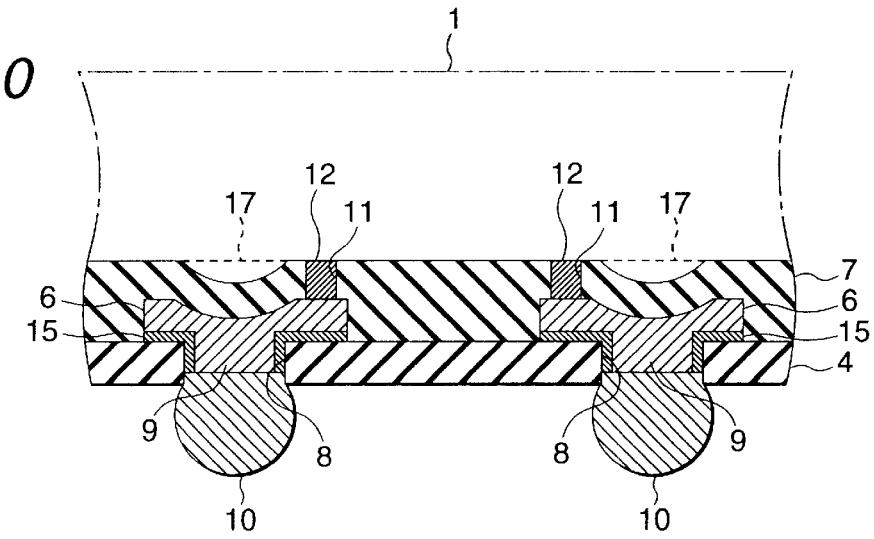
FIG. 10 is an enlarged partial view of the interposer shown in FIG. 9, the conductor layer and conducting passages being formed by continuous plating.

In the resulting interposer 20, since the inner insulator layer 23 is formed on a flat conductor layer 21 as shown in FIG. 8, the inner insulator layer 23 is effectively prevented from unevenness due to sinking in conformity to the unevenness of the underlying conductor layer 21. Therefore, the inner insulator layer 23 can be joined to the semiconductor chip 37 with good adhesion to secure improved reliability. Where, in particular, the inner insulator layer 23 has adhesiveness (heat fusibility) so that it can be adhered to the semiconductor chip 37 by pressing, better adhesion can be secured by uniform pressure application. Where the intervals of the circuit pattern 19 formed of the conductor layer 21 are 30 μm or smaller, the inner insulator layer 23 formed on the pattern is prevented from sinking in the gaps to have unevenness on its surface. As a result, flatness of the inner insulator layer 23 is further ensured to further improve the adhesion to the chip 37 and to further improve the reliability.

While the invention has been described with particular reference to the production of the interposer 20 for chip size packages, the process for producing a printed wiring board according to the invention is not limited to the above-described embodiments. It will be recognized by one skilled in the art that the particulars of the invention are selected appropriately depending on the purpose and use. The printed wiring board according to the invention is, therefore, not limited to the interposer 20 for chip size packages and includes, for example, printed wiring boards in which the second insulator layer has no second through-holes.

According to the purpose and use, the process of the present invention can include other steps, such as a step of forming electrodes. Further, the order of the steps included in the process can be altered appropriately, for example, in such a manner that the step of forming the second insulator layer on the conductor layer may be preceded by the step of removing the substrate.

The present invention will now be illustrated in greater detail with reference to Examples and Comparative Examples, but it should be understood that the invention is not limited thereto. It should be noted that the drawings referred to here are intended to be representative and are not to scale.

EXAMPLE 1

A photosensitive polyamic acid resin having the following composition was applied to a 25 μm thick SUS plate (substrate 32) and dried at 100° C. for 20 minutes to form an outer polyamic acid resin layer 22p (FIG. 2A).

Outer Polyamic Acid Resin Composition

Acid dianhydride component: 3,3',4,4'-oxydiphthalic acid dianhydride (0.5 mol) and 2,2-bis(3,4-dicarboxyphenyl) hexafluoropropane dianhydride (0.5 mol)

Diamine component: 4,4'-diaminodiphenyl ether (0.5 mol) and p-phenylenediamine (0.5 mol)

Photosensitizer: 1-ethyl-3,5-dimethoxycarbonyl-4-(2-nitrophenyl)-1,4-dihydropyridine (0.26 mol)

Organic solvent: N-methyl-2-pyrrolidone

Figure 2D:
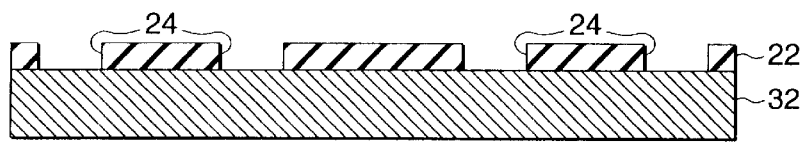

The outer polyamic acid resin layer 22p was irradiated with i-rays through a photomask 28 (FIG. 2B), heated at 170° C. for 3 minutes, and developed with an alkali developer to form outer via-holes 24 having a diameter of 400 μm at the positions mated with the electrodes 36 of an external circuit board 35 (FIG. 2C) The polyamic acid resin layer 22p was cured (imidated) by heating at 400° C. for 30 minutes to form a 10 μm thick outer insulator layer 22 comprising polyimide (FIG. 2D).

Copper was deposited in the outer via-holes 24 to substantially the same level as the upper surface of the outer insulator layer 22 by electroplating using the substrate 32 as a negative electrode to form conducting passages 31 (FIG. 1B). Chromium and copper were deposited in this order on the entire upper surface of the outer insulator layer 22 and the upper surface of the conducting passages 32 by sputtering to deposit thicknesses of about 300 Å and about 1000 Å, respectively, to form a thin metal film 29 (FIG. 1C).

A 15 μm thick dry film (plating resist 34) having a resist pattern of such a line width as to give a circuit pattern 19 having a gap width 30 of 25 μm was applied onto the thin metal layer 29 (FIG. 4A) Copper was deposited on the thin metal film 29 by electroplating using the substrate 32 as a negative electrode to substantially the same level as the upper surface of the plating resist 34 to form a conductor layer 21 (FIG. 4B). The plating resist 34 was removed with an alkali etching solution to form a conductor layer 21 at intervals 30 of 25 μm (FIG. 4C).

The thin metal film 29, i.e., a laminate of a copper film and a chromium film, uncovered with the conductor layer 21 was removed with acid etching solution and an alkali etching solution, respectively (FIG. 1E).

A photosensitive polyamic acid resin having the following composition was applied on the conductor layer 21 and dried at 100° C. for 20 minutes to form an inner polyamic acid resin layer 23p (FIG. 5A).

Inner Polyamic Acid Resin Composition

Acid dianhydride component: 3,3',4,4'-oxydiphthalic acid dianhydride (1.0 mol)

Diamine component: 1,3-bis(3-aminophenoxy)benzene (0.8 mol) and bisaminopropyltetramethyldisiloxane (0.2 mol)

Photosensitizer: 1-ethyl-3,5-dimethoxycarbonyl-4-(2-nitrophenyl)-1,4-dihydropyridine (0.26 mol)

Organic solvent: N-methyl-2-pyrrolidone

Figure 5D:
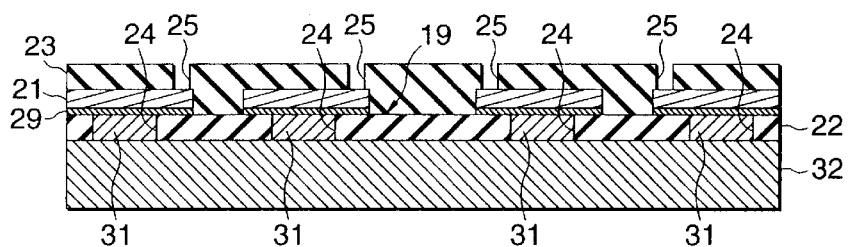

The inner polyamic acid resin layer 23p was exposed to i-rays through a photomask 33 (FIG. 5B), heated at 170° C. for 3 minutes, and developed with an alkali developer to form inner via-holes 25 having a diameter of 50 μm at positions mated with the electrodes of a semiconductor chip 37 (FIG. 5C). The inner polyamic acid resin layer 23p was cured (imidated) by heating at 300° C. for 30 minutes to form a 10 μm thick inner insulator layer 23 comprising polyimide (FIG. 5D)

The inner via-holes 25 were plated with gold to form inner electrodes 27 having a flat top surface (FIG. 1G). The inner electrodes 27 were covered with a strippable protective film (of weak adhesion type; resistant to acid and alkali) by means of a roll laminator, and the substrate 32 was removed completely with an etching solution containing ferric chloride (FIG. 1H). The subbing layer 29 exposed on the outer insulator layer 22, i.e., the laminate of a copper film and a chromium film, was removed with an acid etching solution and an alkali etching solution, respectively, to obtain an interposer 20 for a chip size package.

EXAMPLE 2

An interposer 20 for a chip size package was obtained in the same manner as in Example 1, except that the plating resist 34 used in the step of FIG. 4A had a resist pattern having such a line width that the conductor layer 21 had a circuit pattern 19 having a gap width 30 of 35 μm.

Comparative Example 1

Figure 11A:
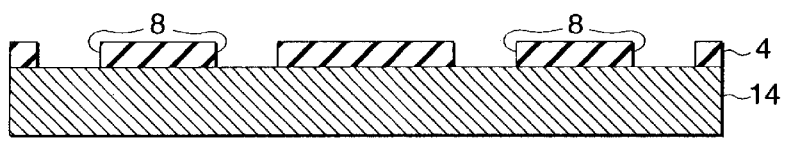
FIGS. 11A–11E show the steps involved for forming the conductor layer and the conducting passages of the interposer shown in FIG. 9 by plating.
Figure 11B:
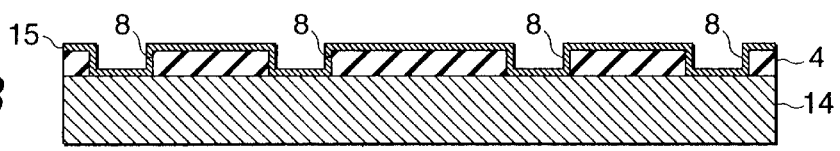
Figure 11C:
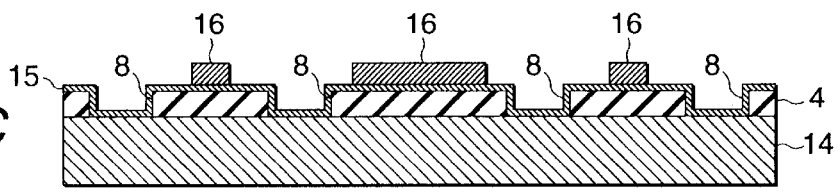
Figure 11D:
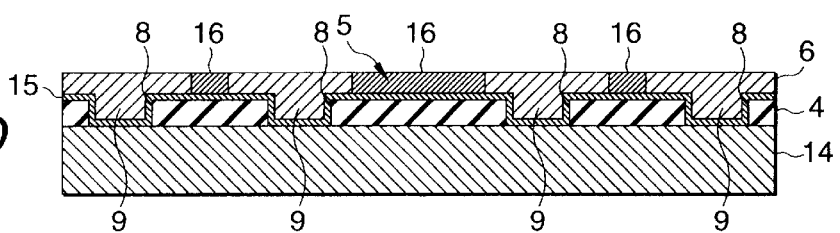
Figure 11E:
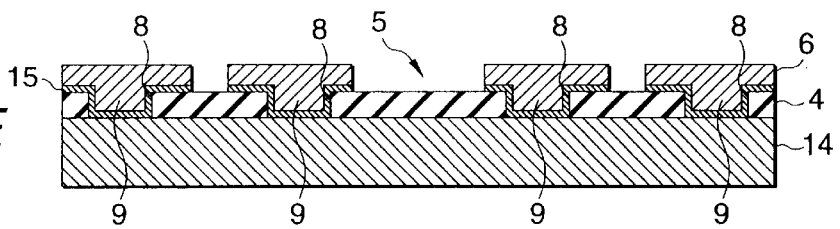

FIGS. 11A–11E are referred to. An outer insulator layer 4 having outer via-holes 8 was formed on a substrate 14 in the same manner as in Example 1 (FIG. 11A). Chromium and copper were deposited in this order by sputtering on the entire upper surface of the outer insulator layer 4 and the upright wall and the bottom of the outer via-holes 8 to a deposit thickness of about 300 A and about 1000 A, respectively, to form a thin metal film 15 (FIG. 11B). A 15 μm thick dry film 16 as a plating resist whose pattern had such a line width as to give a circuit pattern having intervals of 25 μm was formed (FIG. 11C). Copper was deposited in the outer via-holes 8 to form conducting passages 9 and then on the conducting passages 9 and on the outer insulator layer 4 to form a conductor layer 6 in a prescribed circuit pattern by electroplating using the substrate 14 as a negative electrode (FIG. 11D). The thickness of the conductor layer 6 was the same as that of the plating resist 16 (i.e., 15 μm). The plating resist 16 was removed with an alkali etching solution, and the thin metal film 15, i.e., a laminate of a copper film and a chromium film, was removed with an acid etching solution and an alkali etching solution, respectively (FIG. 11E). Thereafter, an inner insulator layer 7 and inner electrodes 12 were formed in the same manner as in Example 1 to obtain an interposer 3.

Comparative Example 2

An interposer 3 was obtained in the same manner as in Comparative Example 1, except that the thin metal film 15 was not provided and that copper was deposited in the outer via-holes 8 to form conducting passages 9 and then on the conducting passages 9 and on the outer insulator layer 4 by electroplating using the substrate 14 as a negative electrode, thereby to form the conductor layer 6 in a prescribed circuit pattern 5. Since the thin metal film 15 was not formed, the formation of the conductor layer 6 was not followed by the step of removing the thin metal film 15.

Evaluation

The interposers obtained in Examples 1 and 2 and Comparative Examples 1 and 2 were each fusion-bonded to a semiconductor chip by applying a pressure of 20 kg/cm$^2$ at 325° C. for 10 second, and the 180° peel strength was measured. Further, each sample was made to absorb moisture in an atmosphere of 30° C. and 70% RH for 168 hours and then put in an IR reflow over at 240° C., and development of blisters of the interposer was observed with the naked eye. The results obtained are shown in table 1 immediately below.

TABLE 1

|  | Example | | Compara. Example | |
| --- | --- | --- | --- | --- |
|  | 1 | 2 | 1 | 2 |
| Circuit Pattern Interval (μm) | 25 | 35 | 25 | 25 |
| Inner Insulator Layer Thickness (μm) | 10 | 10 | 10 | 10 |
| Development of Blister | nil | nil | nil | nil |
| 180° Peel Strength (kg/cm) | 1.5 | 1.4 | 1.0 | 0.9 |

It is clearly seen from Table 1 that the samples of Examples 1 and 2 have higher adhesion between the interposer 20 and the semiconductor chip 37 than the comparative samples. It is also seen that the adhesion of the sample of Example 1 in which the interval 30 of the circuit pattern 19 is 25 μm is better than the sample of Example 2 in which the interval 30 is 35 μm.

The poor adhesion of Comparative Example 1 compared with Examples 1 and 2 can be interpreted as follows. While copper is electrodeposited, both the bottom of the outer via-holes 8 and the upper surface of the outer insulator layer 4 are electrically connected through the thin metal film 15 to the substrate 14 working as a negative electrode. Therefore, the metal being deposited on the bottom of the outer via-holes 8 and the metal being deposited on the outer insulator layer 14 grow almost in the same way. As a result, the parts of the conductor layer 6 formed right on the conducting passages 9 have a lower level at the end of plating, and the inner insulator layer 7 formed thereon also has a lower level at these parts.

Figure 12:
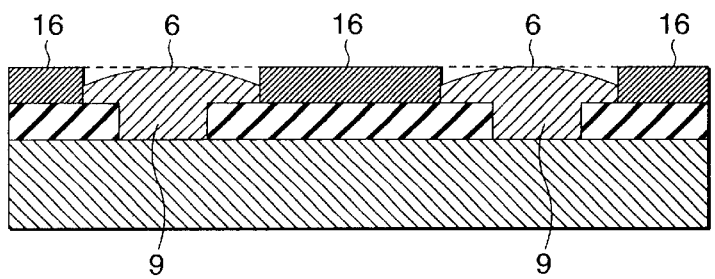
FIG. 12 is an enlarged partial cross section of the interposer of Comparative Example 2 in its course of production.

The still poorer adhesion of Comparative Example 2 compared with Comparative Example 1 can be interpreted as follows. While copper is electrodeposited, the bottom of the outer via-holes 8 is electrically connected to the substrate 14 as a negative electrode, whereas there is no electrical connection between the upper surface of the outer insulator layer 4 and the substrate 14 as a negative electrode. Therefore, the metal being deposited on the bottom of the outer via-holes 8 forms conducting passages 9 and thereafter continues to grow satisfactorily to build a conductor layer 6 on the conducting passages 9. After the conducting passages 9 are built up, the metal begins to precipitate on the upper surface of the outer insulating layer 4 as if the metal being deposited on the conducting passages 9 flows into. As a result, at the end of plating, the peripheral portion of the part of the conductor layer 6 that is not on the conducting passage 9 is lower than the level of the portion of the conductor layer 6 that is on the conducting passage 9 as illustrated in FIG. 12. It is easily recognized that the inner insulator layer 7 formed thereon suffers from unevenness in conformity to this unevenness of the conductor layer 6.

While the invention has been described in detail and with reference to specific examples thereof, it will be apparent to one skilled in the art that various changes and modifications can be made therein without departing from the spirit and scope thereof.

The entire disclosure of each and every foreign patent application from which the benefit of foreign priority has been claimed in the present application is incorporated herein by reference, as if fully set forth below.

What is claimed is:

1. A process for producing a printed wiring board, which comprises the steps of:

(1) forming a first insulator layer having a first through-hole on a substrate, the first through-hole penetrating in a thickness direction of the first insulator layer;

(2) forming a conducting passage through the first through-hole by plating with metal so as to deposit up to substantially a same level as an upper surface of the first insulator layer thus forming an even upper surface;

(3) forming a thin metal film on the first insulator layer and the conducting passage so that the thin metal film has an almost flat surface and lacks unevenness;

(4) forming a conductor layer in a prescribed circuit pattern on the thin metal film by plating so that the conductor layer has an almost flat surface and lacks unevenness;

(5) removing a portion of the thin metal film on which the conductor layer is not formed;

(6) forming a second insulator layer on the conductor layer; and (7) removing the substrate.

2. The process according to claim 1, wherein the substrate comprises a material capable of serving as a negative electrode in electroplating.

3. The process according to claim 1, wherein the second insulator layer has adhesiveness.

4. The process according to claim 1, wherein the second insulator layer comprises a photosensitive polyimide having adhesiveness.

5. The process according to claim 1, wherein the circuit pattern of the conductor layer formed on the thin metal film by plating has an interval of 30 μm or smaller between wires.

6. The process according to claim 1, wherein the step (6) comprises forming the second insulator layer having a second through-hole on the conductor layer, the second through-hole penetrating in a thickness direction of the second insulator layer, and between the steps (6) and (7), the process further comprises forming an electrode through the second-through hole by plating.

7. The process according to claim 1, wherein the first insulator layer is formed by using a photosensitive resin.

* * * * *